(12) United States Patent
Mukasa et al.

(10) Patent No.: US 6,750,450 B2
(45) Date of Patent: Jun. 15, 2004

(54) SCANNING MAGNETISM DETECTOR AND PROBE

(75) Inventors: Koichi Mukasa, Sapporo (JP); Makoto Sawamura, Sapporo (JP); Kazuhisa Sueoka, Sapporo (JP); Eiichi Hirota, Hirakata (JP)

(73) Assignee: Hokkaido University, Sapporo (JP)

( * ) Notice: Subject to any disclaimer, the term of this patent is extended or adjusted under 35 U.S.C. 154(b) by 41 days.

(21) Appl. No.: 10/092,343

(22) Filed: Mar. 5, 2002

(65) Prior Publication Data

US 2002/0149362 A1 Oct. 17, 2002

(30) Foreign Application Priority Data

Mar. 5, 2001 (JP) ........................... 2001-059440

(51) Int. Cl.[7] ............................................... G01N 23/00
(52) U.S. Cl. ........................................................ 250/306
(58) Field of Search ................................ 250/306, 307, 250/310, 311

(56) References Cited

U.S. PATENT DOCUMENTS 4,985,627 A * 1/1991 Gutierrez et al. ............. 250/306

FOREIGN PATENT DOCUMENTS

| JP | 09043324 | | 2/1997 | ......... G01R/33/032 |
|---|---|---|---|---|
| JP | 11-108610 | * | 4/1999 | ............ G01B/7/34 |
| JP | 11223637 | | 8/1999 | .......... G01N/37/00 |
| JP | 11295326 | | 10/1999 | .......... G01N/37/00 |
| JP | 2001264230 A | | 9/2001 | .......... G01N/13/16 |
| JP | 2002-202238 | * | 7/2002 | .......... G01N/13/12 |
| JP | 2002-257703 | | 9/2002 | .......... G01N/13/12 |

OTHER PUBLICATIONS

K. Sueoka and K. Mukasa, *Development of Spin–Dependent Scanning Tunneling Microscopy*, School of Engineering, Hokkaido University and CREST, JST, vol. 24, No. 12, 2000.

* cited by examiner

*Primary Examiner*—John R. Lee
*Assistant Examiner*—Christopher M. Kalivoda
(74) *Attorney, Agent, or Firm*—Stoel Rives LLP

(57) ABSTRACT

A scanning magnetism detector includes a probe made of a solid material formed of a single crystal having spin polarization and electrical conductivity properties. When the probe is brought into proximity with a magnetic substance, a surface condition of the magnetic substance can be detected by measuring tunnel current flow between the probe and the surface of the magnetic substance.

23 Claims, 1 Drawing Sheet

SCANNING MAGNETISM DETECTOR AND PROBE

RELATED APPLICATIONS

This application claims priority from Japanese Patent Application No. 2001-59,440 under 35 U.S.C. § 119.

TECHNICAL FIELD

This invention relates to a scanning magnetism detector for use with a tunnel electron microscope and a probe for use with the scanning magnetism detector.

BACKGROUND OF THE INVENTION

A conventional scanning magnetism detector has a probe made of a ferromagnetic metal or a single crystal of chromium dioxide. Such scanning magnetism detectors are employed to investigate the surface condition of a magnetic substance on an atomic scale through measurement of a tunnel current between the probe and the magnetic substance.

In a scanning magnetism detector having a probe composed of ferromagnetic metal, the probe may undergo strong magnetic interaction with the magnetic substance being measured. Thus, a measured magnetic condition of the magnetic substance may be distorted. This distortion can make it difficult to precisely investigate surface conditions of the magnetic substance.

On the other hand, in a scanning magnetism detector having a probe composed of a chromium dioxide single crystal, a residual magnetic condition (spin condition) at the probe tip is normally present. Furthermore, the probe tip may be contaminated because of physical properties of the oxide.

Because of these limitations, a scanning magnetism detector having a probe composed of a Group III-V semiconductor compound has been proposed. In a scanning magnetism detector, a tunnel current of spin-polarized conduction electrons of the Group III-V semiconductor compound can be used because of photoexcitation of the spin polarized electrons. Since the Group III-V semiconductor compound is non-magnetic, the above-mentioned magnetic distortion does not occur. However, such a detector will normally be large and complex because a laser system may be required.

SUMMARY OF THE INVENTION

An object of the present invention is to provide a new probe for use with a scanning magnetism detector.

The present invention relates to a scanning magnetism detector comprising a probe made of a solid material of a single crystal having spin polarization and electrical conductivity properties. The probe positioned in proximity to a magnetic substance enables detection of its surface condition by measurement of a tunnel current flowing between the probe and the surface of the magnetic substance.

The present invention also relates to a probe made and used as described above for a scanning magnetism detector.

When a probe of the scanning magnetism detector in accordance with the present invention is positioned in proximity to a surface of a given magnetic substance, a wave function of electrons in a forefront region or tip of the probe overlaps with an S-type wave function of electrons in the surface of the magnetic substance. Under these circumstances, the probe is magnetically saturated by an exchange interaction from the magnetic field of the magnetic substance and, as a consequence, a tunnel current flows between the probe and the magnetic substance. The amount and the direction of the tunnel current depend on the magnitude and the direction of the magnetic moment in the surface of the magnetic substance.

As the magnitude of the magnetic moment in the surface of the magnetic substance becomes larger, the amount of the tunnel current becomes larger. The tunnel current flows in a direction that is parallel to the direction of the magnetic moment.

If the type and the arrangement of atoms forming the surface of the magnetic substance are changed, then the magnetic moment of the magnetic substance is also changed. Therefore, the amount and the direction of the detected tunnel current depend on the type and the arrangement of the atoms constituting the surface of the magnetic substance. The surface condition of the magnetic substance can, therefore, be detected by the amount and the direction of the tunnel current.

Additional aspects and advantages of this invention will be apparent from the following detailed description of preferred embodiments thereof.

DETAILED DESCRIPTION OF THE PREFERRED EMBODIMENTS

Figure 1:
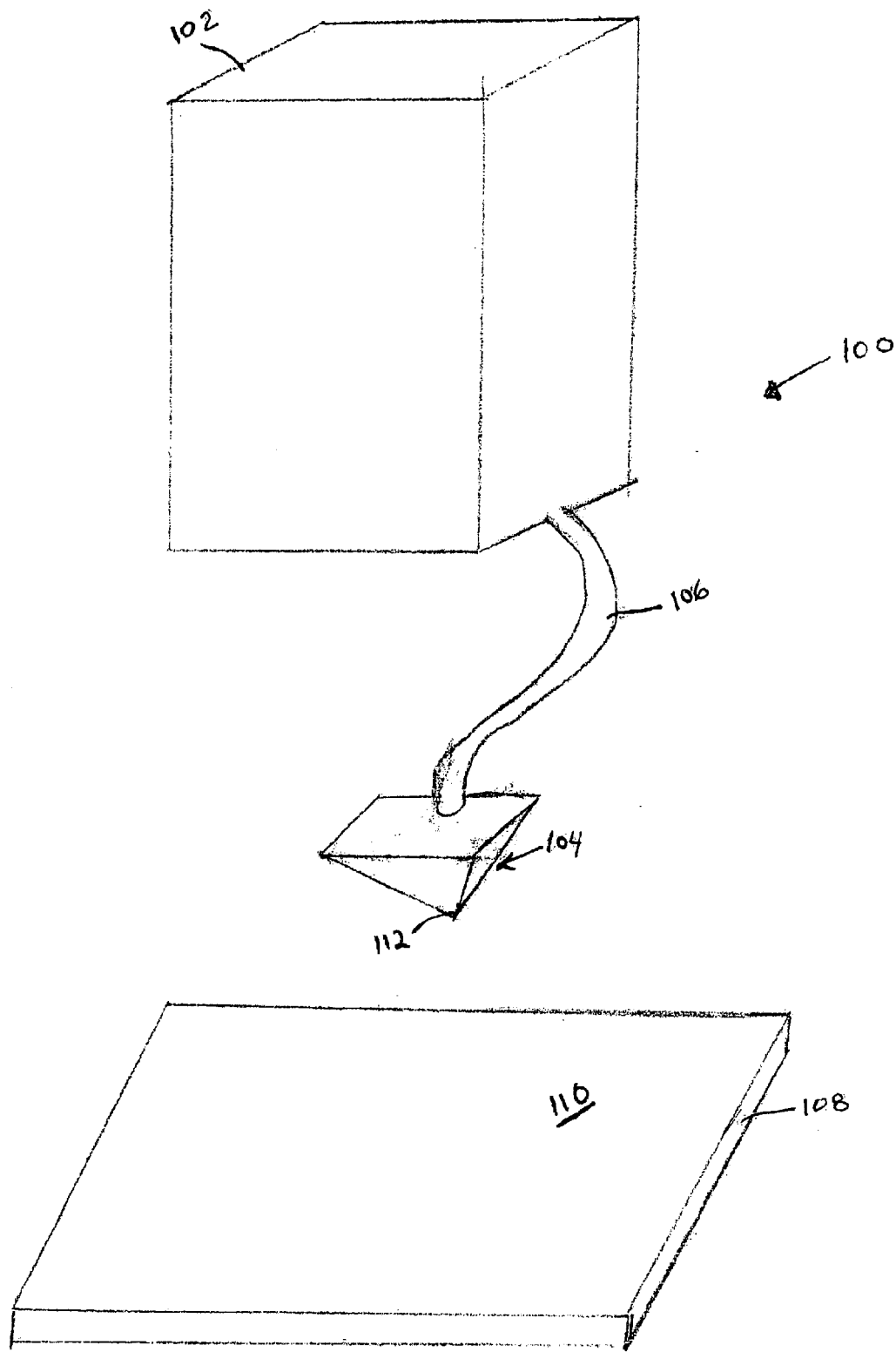
FIG. 1 is a simplified diagram showing a scanning magnetism detector that includes a probe for detecting a surface condition of a magnetic substance.

FIG. 1 depicts a scanning magnetism detector 100 that includes a scanning electron microscope 102 to which a probe 104 is connected by a cable 106 for detecting a surface condition of a magnetic substance 108. In accordance with the present invention and as described in greater detail below, when probe 104 is positioned in proximity to magnetic substance 108 a tunnel current flows between a surface 110 of the magnetic substance and a forefront region or tip 112 of probe 104. The direction and quantity of the tunnel current depend upon the surface condition of surface 110. Scanning magnetism detector 100 measures the direction and quantity of the tunnel current to detect the surface condition of surface 110.

In the present invention, probe 104 for scanning magnetism detector 100 is made of a single crystal solid material having electrical conductivity and spin polarization properties. Two examples of types of material that satisfy the above properties are as follows: a solid material that intrinsically has electrical conductivity and spin polarization properties; and a solid material that intrinsically is electrically nonconductive but has spin polarization properties, and that has added donor elements to produce the desired electrical conductivity.

Examples of suitable materials that have electrical conductivity and spin polarization properties are as follows: CuF; CuCl; AgI; ZnS; ZnSe; CdS; CdSe; BP; AlAs; AlP; AlSb; GaN; GaP; GaAs; GaSb; InAs; InP; InSb; and SiC, all of which have a zinc-blende crystal structure. Other examples of suitable materials that have electrical conductivity and spin polarization properties are as follows: Si; Ge; and Sn, all of which have a diamond crystal structure.

Examples of solid materials with spin polarization and electrical conductivity properties resulting from added donor elements are BN, which has a zinc-blende crystal structure, and C, which has diamond crystal structure.

Since solid materials having a zinc-blende crystal structure or a diamond crystal structure have imperfect non-bonding electron orbits therein, the above-mentioned solid materials can exhibit acceptable spin polarization.

Examples of donor elements for solid materials that are not electrically conductive, as described above, include B as a Group III element in periodic table of elements and P or As as Group V elements in the periodic table of elements. These elements are substituted for atoms at some of the crystal lattice sites of the solid material and can function as electron supply sources in probe 104 in accordance with the present invention to provide electrical conductivity for probes composed of the solid materials that are not inherently electrically conductive.

The configuration of probe 104 can take a wide variety of shapes. Probes made of materials having a zinc-blende crystal structure or a diamond crystal structure as mentioned above are preferably formed in a pyramid shape, as shown in FIG. 1.

Forefront region 112 of the pyramid-shaped probe 104 is preferably constructed of crossed crystal faces of the solid material having a zinc-blende crystal structure or a diamond crystal structure. Pyramid-shaped probe 104 is symmetric about an axis running through the vertex of the pyramid. Because it is made of a non-magnetic solid material as described above, pyramid-shaped probe 104 has a magnetic moment that is generated around the axis running through the vertex of the pyramid. The surface condition of magnetic substance 108 can, therefore, be detected precisely by the pyramid-shaped probe 104 without being affected by any magnetic condition of magnetic substance 108.

The dimensions of probe 104 made in accordance with the present invention depend on the particular type of information sought about the surface 110 of magnetic substance 108. For detecting surface conditions of magnetic substance 108 on an atomic scale, and thus, providing a practical probe 104 and a practical scanning magnetism detector 100, the dimensions of probe 104 are set to 100 nm or below, and preferably at 10 nm or below.

The term "the dimension of the probe" in this context means the size of each component that defines a configuration of the probe. For example, in the case of a pyramid-shaped probe, the term "the dimension of the probe" refers to the height of the pyramid and the length of the base of the pyramid.

In a presently preferred embodiment, probe 104 is made by cleaving a bulky solid material of one of the types mentioned above. In this case, such a pyramid-shaped probe 104 can be readily made to conform with specified design dimensions.

Alternatively, probe 104 may be made by crystal growth in accordance with a CVD method or a MOCVD method.

Scanning magnetism detector 100 may be employed as a scanning magnetic force microscope or a scanning tunnel electron microscope, depending upon the configuration of and the detection principle employed by the detector. By replacing the probe of a conventional scanning tunnel electron microprobe with probe 104 made in accordance with the present invention, a scanning tunnel electron microscope can be converted into a scanning magnetism detector in accordance with the present invention.

Although the present invention has been described in detail with reference to the above examples, the invention is not limited to them and numerous variations or modification may be made without departing from the scope of the present invention.

In accordance with the present invention, scanning magnetism detector 100 includes probe 104 made of a single crystal solid material having a spin polarization property. Scanning magnetism detector 100 of the present invention can measure a tunnel current flow between probe 104 of magnetism detector 100 and magnetic substance 108. Since the amount and the direction of the tunnel current depend on the surface condition of magnetic substance 108, the surface condition can be detected precisely by measuring the tunnel current.

It will be obvious to those having skill in the art that many changes may be made to the details of the above-described embodiments of this invention without departing from the underlying principles thereof. The scope of the present invention should, therefore, be determined only by the following claims.

What is claimed is:

1. In a scanning magnetism detector comprising a probe that detects a surface condition of a magnetic substance by responding to a tunnel current of spin-polarized conduction electrons flowing between the probe and the magnetic substance, the improvement comprising:
a probe formed of a solid material of single crystal having spin polarization in absence of optical excitation and electrical conductivity, the probe, when positioned in proximity to a surface of the magnetic substance, causing tunnel current flow between the probe and the surface of the magnetic substance and thereby enabling detection of the surface condition of the magnetic substance by measurement of the tunnel current.

2. A scanning magnetism detector according to claim 1, wherein the solid material is a single crystal material having a zinc-blende crystal structure.

3. A scanning magnetism detector according to claim 2, wherein the solid material is at least one material selected from the group consisting of CuF, CuCl, AgI, ZuS, ZnSe, CdS, CdSe, BP, AlAs, AlP, AlSb, GaN, GaP, GaAs, GaSb, InAs, InP, InSb, and SiC.

4. A scanning magnetism detector according to claim 2, wherein the solid material is a BN single crystal, and in which a crystal lattice site of the solid material is replaced by a donor element.

5. A scanning magnetism detector according to claim 1, wherein the solid material is a single crystal material having a diamond crystal structure.

6. A scanning magnetism detector according to claim 5, wherein the solid material is at least one material selected from the group consisting of Si, Ge, and Sn.

7. A scanning magnetism detector according to claim 5, wherein the solid material is a carbon single crystal, and wherein a crystal lattice site of the carbon single crystal is replaced by a donor element.

8. A scanning magnetism detector according to claims 2, 3, 4, 5, 6, or 7, wherein the probe is of substantially pyramidal shape.

9. A scanning magnetism detector according to claim 1, wherein each dimension of the probe is at most 10 nm.

10. A scanning magnetism detector according to claim 2, wherein the probe is formed with a cleaved bulky single crystal.

11. A scanning magnetism detector according to claim 5, wherein the probe is formed with a cleaved bulky single crystal.

12. A scanning tunnel electron microprobe comprising a scanning magnetism detector according to claims 1, 2, 3, 4, 5, 6, 7, or 8.

13. A probe for a scanning magnetism detector, the probe comprising a solid material of single crystal having spin polarization in absence of optical excitation and electrical conductivity, and the probe, when positioned in proximity to a surface of a magnetic substance, causing tunnel current flow between the probe and the surface of the magnetic substance and thereby enabling detection of the surface condition of the magnetic substance by measurement of the tunnel current.

14. A probe according to claim 13, wherein the solid material is a single crystal material having a zinc-blende crystal structure.

15. A probe according to claim 14, wherein the solid material is at least one material selected from the group consisting of CuF, CuCl, AgI, ZnS, ZnSe, CdS, CdSe, BP, AlAs, AlP, AlSb, GaN, GaP, GaAs, GaSb, InAs, InP, InSb, and SiC.

16. probe according to claim 14, wherein the solid material is a BN single crystal, and wherein a crystal lattice site of the BN single crystal is replaced by a donor element.

17. A probe according to claim 13, wherein the solid material is a single crystal material having a diamond crystal structure.

18. A probe according to claim 17, wherein the solid material is at least one material selected from the group consisting of Si, Ge and Sn.

19. A probe according to claim 17, wherein the solid material is a carbon single crystal, and in which a crystal lattice site is replaced by a donor element.

20. A probe according to claim 13, wherein the probe is of substantially pyramidal shape.

21. A probe according to claim 13, wherein each dimension of the probe is at most 10 nm.

22. A probe according to claim 14, wherein the probe is formed with a cleaved bulky single crystal.

23. A probe according to claim 17, wherein the probe is formed with a cleaved bulky single crystal.

* * * * *